United States Patent
Lee et al.

(10) Patent No.: US 6,964,922 B2
(45) Date of Patent: Nov. 15, 2005

(54) METHODS FOR FORMING METAL INTERCONNECTIONS FOR SEMICONDUCTOR DEVICES HAVING MULTIPLE METAL DEPOSITIONS

(75) Inventors: Jong-myeong Lee, Kyungki-do (KR); Hyeon-deok Lee, Seoul (KR); In-sun Park, Kyungki-do (KR); Ju-bum Lee, Kyungki-do (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 93 days.

(21) Appl. No.: 10/353,386

(22) Filed: Jan. 28, 2003

(65) Prior Publication Data

US 2003/0186539 A1  Oct. 2, 2003

(30) Foreign Application Priority Data

Mar. 12, 2002 (KR) ................................ 2002-13264

(51) Int. Cl.[7] ..................... H01L 21/44; H01L 21/4763
(52) U.S. Cl. ...................... 438/688; 438/622; 438/625; 438/641; 438/674
(58) Field of Search ................. 438/622, 631–632, 438/641, 674–681, 685, 687, 688, 625–629

(56) References Cited

U.S. PATENT DOCUMENTS

| 4,687,552 | A |   | 8/1987  | Early et al.      |
|-----------|---|---|---------|-------------------|
| 4,902,533 | A |   | 2/1990  | White et al.      |
| 4,963,511 | A |   | 10/1990 | Smith             |
| 5,055,423 | A |   | 10/1991 | Smith et al.      |
| 5,151,168 | A |   | 9/1992  | Gilton et al.     |
| 5,312,773 | A |   | 5/1994  | Nagashima         |
| 5,572,072 | A |   | 11/1996 | Lee               |
| 5,589,425 | A |   | 12/1996 | Hoshino et al.    |
| 5,595,937 | A | * | 1/1997  | Mikagi ............ 438/626 |
| 5,604,153 | A |   | 2/1997  | Tsubouchi et al.  |
| 5,633,199 | A |   | 5/1997  | Fiordalice        |

(Continued)

FOREIGN PATENT DOCUMENTS

EP         0831523 A2    3/1998

(Continued)

*Primary Examiner*—Carl Whitehead, Jr.
*Assistant Examiner*—Thanhha Pham
(74) *Attorney, Agent, or Firm*—Myers Bigel Sibley & Sajovec (57) ABSTRACT

Methods of forming an integrated circuit device can include forming an interlevel dielectric film on an integrated circuit substrate including a conductive portion thereof. The interlevel dielectric film includes a contact hole therein exposing a portion of the conductive portion of the integrated circuit substrate, and the dielectric film includes a trench therein communicating with the contact hole wherein the trench is in a surface of the interlevel dielectric film opposite the integrated circuit substrate. A first metal layer is formed in the contact hole preferentially with respect to formation of the first metal layer on a surface of the interlevel dielectric film opposite the integrated circuit substrate. After preferentially forming the first metal layer in the contact hole, a second metal layer is formed on the surface of the interlevel dielectric film opposite the integrated circuit substrate.

26 Claims, 7 Drawing Sheets

U.S. PATENT DOCUMENTS

| | | | |
|---|---|---|---|
| 5,654,245 A * | 8/1997 | Allen | 438/629 |
| 5,846,877 A | 12/1998 | Kim | |
| 6,001,420 A | 12/1999 | Mosely | |
| 6,080,665 A | 6/2000 | Chen et al. | |
| 6,133,147 A | 10/2000 | Rhee et al. | |
| 6,245,655 B1 | 6/2001 | Moslehi | |
| 6,376,355 B1 * | 4/2002 | Yoon et al. | 438/618 |
| 6,432,820 B1 | 8/2002 | Lee et al. | |
| 6,727,176 B2 * | 4/2004 | Ngo et al. | 438/660 |
| 6,787,460 B2 * | 9/2004 | Lee et al. | 438/672 |
| 2002/0030210 A1 | 3/2002 | Matsui et al. | |

FOREIGN PATENT DOCUMENTS

| | | | |
|---|---|---|---|
| JP | 07-167340 A | | 4/1995 |
| JP | 11-186390 | * | 7/1999 |

* cited by examiner

METHODS FOR FORMING METAL INTERCONNECTIONS FOR SEMICONDUCTOR DEVICES HAVING MULTIPLE METAL DEPOSITIONS

BACKGROUND OF THE INVENTION

This application claims the priority of Korean Patent, Application No. 2002-13264, filed Mar. 12, 2002, which is incorporated herein in its entirety by reference.

FIELD OF THE INVENTION

The present invention relates to methods of forming integrated circuits, and more particularly to methods for manufacturing semiconductor integrated circuits having a multilayer metal interconnection structure and related structures.

DESCRIPTION OF THE RELATED ART

As line widths of circuits decrease, there may be technical limitations in adopting a conventional deposition process of forming interconnections when semiconductor devices using interconnection materials such as aluminum, are manufactured. Accordingly, there may be a higher demand for techniques of filling a contact hole, which is a connection part of a lower conductive layer and an upper aluminum interconnection, or a via hole, which is a connection part of a lower aluminum interconnection and an upper aluminum interconnection, with an interconnection material such that electrical connections therebetween are possible.

When the contact hole or via hole (hereinafter, is short for "contact hole") is filled with aluminum, in order to obtain higher electrical characteristics and more perfect filling characteristics, various processing techniques have been developed. When manufacturing memory devices to be used in the next generation, in a deposition process of forming metal interconnections having circuit line widths of less than 0.25 µm, aspect ratios of the contact holes may be high, and, thus, it may be inappropriate to depend only on physical vapor deposition (PVD) such as sputtering. To address this problem, processes of forming aluminum interconnections using chemical vapor deposition (CVD) having higher step coverage than in PVD have been developed. In particular, a preferential metal deposition (PMD) process of selectively forming an aluminum layer only in the contact hole using CVD and depositing the aluminum layer by PVD outside of the contact hole, has been studied. In the PMD process, to selectively form an aluminum thin film only in the contact hole, a metal deposition prevention layer is formed on a top surface of an interlevel dielectric (ILD) film pattern for defining the contact hole, and only the inside of the contact hole is exposed, and then the aluminum thin film is formed in the exposed contact hole by CVD. If the aluminum thin film is formed in the contact hole in this way, there is little consumption of an aluminum precursor outside of the contact hole, and thus the sufficient amount of the aluminum precursor is supplied to the contact hole, and higher step coverage can be obtained than step coverage which can be obtained when aluminum is blanket deposited. Thus, the above-mentioned PMD process can be advantageously adopted in a process of filling a contact hole, which is deep and has a small size, with aluminum.

Meanwhile, as semiconductor devices become more highly integrated and the sizes of patterns become finer, a dual damascene process can be adopted to form aluminum interconnections. In order to form aluminum interconnections by adopting the dual damascene process, an ILD film is first patterned, and contact holes, which communicate with one another, and line-shaped trenches are formed, thereby forming a dual damascene structure. As design rules decrease, critical dimensions (CD) of trenches for presenting the dual damascene structure decrease, and aspect ratios of the trenches increase. In order to form metal interconnections using the PMD process in the dual damascene structure, the trenches can be filled with interconnection materials by depositing metal materials in the trenches using a PVD process and reflowing the metal materials. However, in the case of trenches having high aspect ratios, as described above, it may be difficult to fill the trenches using PVD and reflowing metal materials. Thus, it may be desirable to develop a PMD process, which can be adopted when forming metal interconnections of a semiconductor device having a dual damascene structure, which may be required for a highly-integrated semiconductor devices using relatively small design rules.

SUMMARY OF THE INVENTION

According to embodiments of the present invention, methods of forming an integrated circuit device can include forming an interlevel dielectric film on an integrated circuit substrate including a conductive portion thereof. More particularly, the interlevel dielectric film can include a contact hole therein exposing a portion of the conductive portion of the integrated circuit substrate and the interlevel dielectric film can also include a trench therein communicating with the contact hole wherein the trench is in a surface of the interlevel dielectric film opposite the integrated circuit substrate. A first metal layer can be formed in the contact hole preferentially with respect to formation of the first metal layer on a surface of the interlevel dielectric film opposite the integrated circuit substrate. After preferentially forming the first metal layer in the contact hole, a second metal layer is formed on the surface of the interlevel dielectric film opposite the integrated circuit substrate.

A metal inhibiting layer can be formed on the surface of the interlevel dielectric film and on sidewalls of the trench preferentially with respect to formation of the metal inhibiting layer in the contact hole before preferentially forming the first metal layer. The metal inhibiting layer may comprise a metal oxide such as an oxide of Al, Zr, Ti, Ta, Sr, Mg, Ba, Ca, Ce, and/or Y. Alternatively or in addition to, the metal inhibiting layer may comprise metal nitride and/or silicon carbide.

In addition, the metal inhibiting layer may be treated after forming the first metal layer and before forming the second metal layer to facilitate forming the second metal layer thereon. More particularly, treating the metal inhibiting layer may include forming a wetting layer on the metal inhibiting layer opposite the interlevel dielectric film, and the wetting layer may be selected from at least one of Ti, TiN, Ta, and/or TaN. A barrier metal layer can also be formed on sidewalls of the contact hose and the trench before forming the metal inhibiting layer, and the barrier metal layer can include at least one of TiN, TaN, TiAlN, TiSiN, TaAlN, TaSiN, and/or WN.

According to additional embodiments of the present invention, methods of forming integrated circuit devices can include forming an interlevel dielectric film on an integrated circuit substrate including a conductive portion thereof. Moreover, the interlevel dielectric film can include a contact hole therein exposing a portion of the conductive portion of the integrated circuit substrate. A metal inhibiting layer can be formed on a surface of the interlevel dielectric film opposite the integrated circuit substrate preferentially with respect to formation of the metal inhibiting layer in the contact hole, and a first metal layer can be formed in the contact hole preferentially with respect to formation of the first metal layer on the metal inhibiting layer. After preferentially forming the first metal layer in the contact hole, a second metal layer can be formed on the interlevel dielectric film opposite the integrated circuit substrate.

The dielectric film can include a trench therein communicating with the contact hole wherein the trench is in a surface of the interlevel dielectric film opposite the integrated circuit substrate. Moreover, the metal inhibiting layer can be formed on sidewalls of the trench, and the second metal layer can be formed in the trench. The metal inhibiting layer can include a metal oxide such as an oxide of Al, Zr, Ti, Ta, Sr, Mg, Ba, Ca, Ce, and/or Y. Alternatively or in addition, the metal inhibiting layer can include a metal nitride layer and/or a silicon carbide layer. In addition, the metal inhibiting layer can be treated after forming the first metal layer and before forming the second metal layer to facilitate forming the second metal layer thereon. More particularly, treating the metal inhibiting layer can include forming a wetting layer on the metal inhibiting layer opposite the interlevel dielectric film, and the wetting layer can be selected from at least one of Ti, TiN, Ta, and/or TaN.

A barrier metal layer can also be formed on sidewalls of the contact hose and the trench before forming the metal inhibiting layer, and the barrier metal layer can be selected from at least one of TiN, TaN, TiAlN, TiSiN, TaAlN, TaSiN, and/or WN. A third metal layer can also be formed on the second metal layer after forming the second metal layer, and the third metal layer can be reflowed. In addition, selectively forming the first metal layer can include forming the first metal layer using chemical vapor deposition, and forming the second metal layer can include forming the second metal layer using chemical vapor deposition.

BRIEF DESCRIPTION OF THE DRAWINGS

The above objective and advantages of the present invention will become more apparent by describing in detail a preferred embodiment thereof with reference to the attached drawings in which.

DETAILED DESCRIPTION OF THE INVENTION

The present invention will be descried more fully hereinafter with reference to the accompanying drawings in which preferred embodiments of the invention are shown. This invention may, however, be embodied in many different forms and should not be construed as being limited to the embodiments set forth herein. Rather, these embodiments are provided so that this disclosure will be through and complete, and will fully convey the scope of the invention to those skilled in the art. In the drawings, the forms of elements are exaggerated for clarity. Like reference numerals refer to like elements throughout the drawings. It will be understood that when a layer is referred to as being on another layer or "on" a semiconductor substrate, it can be directly on the other layer or on the semiconductor substrate, or intervening layers may also be present.

FIGS. 1A through 1H are cross-sectional views illustrating methods for forming metal interconnections of a semiconductor device according to first embodiments of the present invention.

Figure 1A:
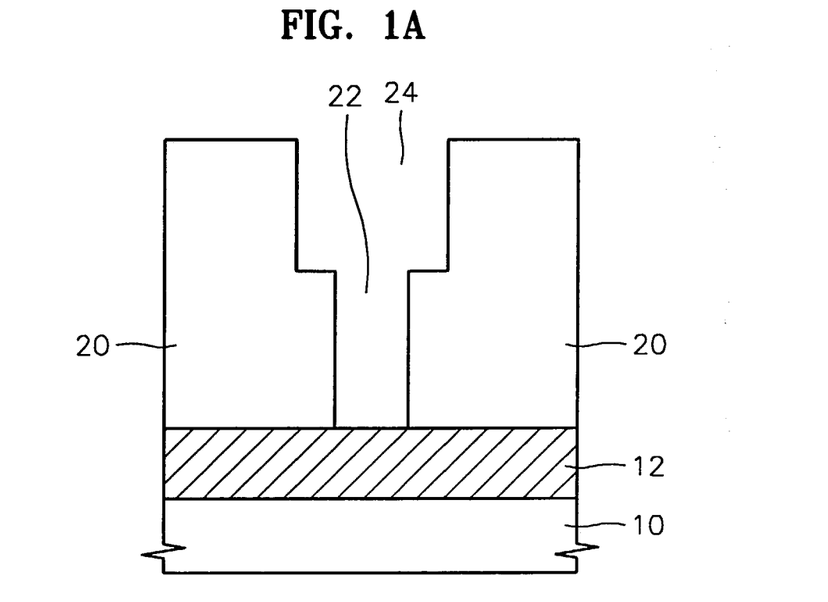
FIGS. 1A through 1H are cross-sectional views illustrating methods for forming metal interconnections of semiconductor devices according to first embodiments of the present invention.

Referring to FIG. 1A, an interlevel dielectric (ILD) film 20 is formed on a semiconductor substrate 10 on which a conductive region 12 is exposed. The ILD film 20 is patterned to define a contact hole 22 by which the conductive region 12 is exposed, and a line-shaped trench 24 which communicates with the upper portion of the contact hole 22. The trench 24 is provided to form metal interconnections of a semiconductor device having a dual damascene structure, which may be required for a highly-integrated semiconductor device with a relatively small design rule and having a relatively high aspect ratio of more than 1.

The conductive region 12 may include source and drain regions, or an N+ or P+ conductive layer comprising a transistor disposed on the semiconductor substrate 10. Alternatively, the conductive region 12 may include a metal interconnection on an insulating layer formed on the semiconductor substrate 10 that is connected to the source and drain regions of the transistor. In this case, the contact hole 22 constitutes a via hole. The trench 24 can be a region in which a line type interconnection is to be formed. For example, the ILD film 20 may be formed of a borophosphosilicate glass (BPSG) layer and/or an undoped silicon oxide layer.

Figure 1B:
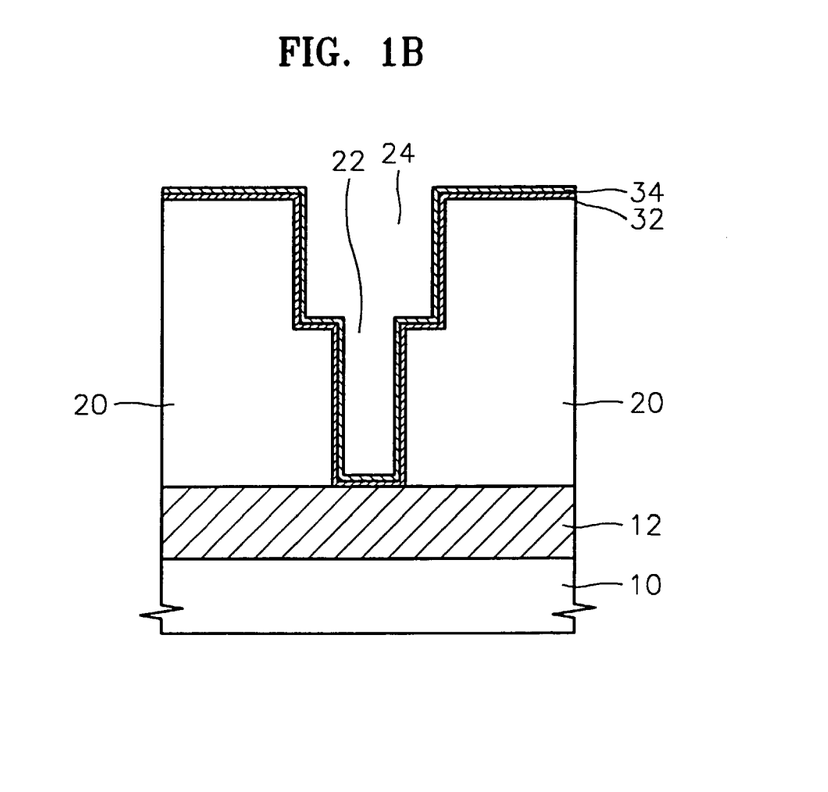

Referring to FIG. 1B, a resistive metal layer 32 and a barrier metal layer 34 are sequentially formed on the entire surface of a resulting structure including the patterned ILD film 20. The resistive metal layer 32 can be formed of Ti or Ta, preferably, Ti. Also, the barrier metal layer 34 can be formed of TiN, TaN, TiAlN, TiSiN, TaAlN, TaSiN and/or WN, preferably, TiN.

Subsequently, the barrier metal layer 34 can be heat-treated. In the case of source and drain regions including an impurity layer, a metal silicide layer can be formed by the reaction of metal atoms in the resistive metal layer 32 with silicon atoms in the impurity layer by heat treatment, and simultaneously an oxygen stuffing effect in which a grain boundary region of the barrier metal layer 34 is filled with oxygen atoms, can be obtained. Likewise, if the barrier metal layer 34 is heat-treated, contact resistance can be improved by the metal silicide layer formed between the conductive region 12 and the barrier metal layer 34, and a phenomenon in which silicon atoms in the conductive region 12 and aluminum atoms in the metal layer formed in a subsequent process are dispersed through the barrier metal layer 34 can be suppressed. When the conductive region 12 constitutes a metal interconnection, that is, when the contact hole 22 is a via hole by which the metal interconnection is exposed, a step of forming the barrier metal layer 34 and a heat-treatment step may be omitted.

Figure 1C:
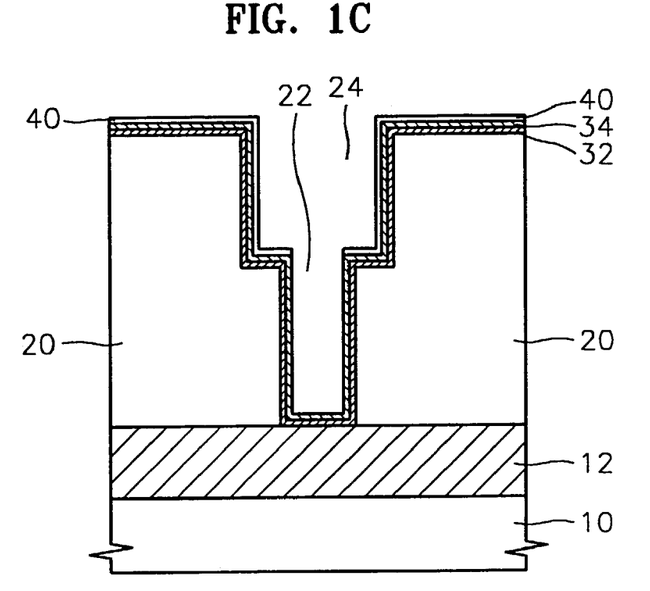

Referring to FIG. 1C, a metal deposition prevention layer 40 is formed on the top surface of the ILD film pattern 20 and a bottom surface and sidewalls of the trench 24 such that the inside wall of the contact hole 22 defined by the barrier metal layer 34 is exposed. For example, the metal deposition prevention layer 40 may be formed of an insulating layer such as an aluminum oxide layer, an aluminum nitride layer, a tantalum oxide layer, a titanium oxide layer, and/or a silicon carbide (SiC) layer.

As an example of forming the metal deposition prevention layer 40, a metal thin film having the thickness between about 20 and 300 Å can be formed on the top surface of the ILD film pattern 20 and the bottom surface and sidewalls of the trench 24 by PVD such as sputtering, and the metal thin film can be oxidized. The metal thin film can be formed of a material having a larger oxidizing property than Si. For example, the metal thin film may be formed of Al, Zr, Ti, Ta, Sr, Mg, Ba, Ca, Ce, and/or Y. Here, it is preferable that a direct current (DC) magnetron sputter in which a collimator is not mounted is used when the metal thin film is formed. A DC magnetron sputtering process of forming the metal thin film may be performed at a relatively low temperature between about 10 and 30° C. under a pressure between about 3 and 10 mTorr, preferably, between about 5 and 10 m Torr. If the metal thin film is formed under the above conditions using a DC magnetron sputter in which the collimator is not mounted, a straight advancing property of the sputtered metal atoms can be reduced so that the metal thin film is not significantly formed in the contact hole 22. Thus, the metal thin film can be formed on the top surface of the ILD film 20 and the bottom surface and sidewalls of the trench 24, and the barrier metal layer 34 can be exposed in the contact hole 22.

There are various methods for oxidizing the metal thin film to form the metal deposition prevention layer 40. For example, a method for oxidizing the metal thin film to form the metal deposition prevention layer 40 can include providing an $O_2$ gas atmosphere in a closed space maintained at a pressure lower than atmospheric pressure. Alternatively, a method for oxidizing the metal thin film at a mixed gas atmosphere of an oxygen-containing gas and an inert gas in a closed space maintained at a pressure lower than atmospheric pressure may be used to form the metal deposition prevention layer 40. The oxygen-containing gas may comprise $O_2$, $O_3$, and/or $N_2O$. Alternatively, the metal thin film may be exposed in air or exposed to oxygen plasma.

As another example of forming the metal deposition prevention layer 40, the metal thin film can be nitrided after a metal thin film is formed as discussed above. For example, when the metal thin film is an Al thin film, the Al thin film can be nitrided by exposing a resulting structure including the Al thin film, or by rapidly heat-treating the resulting structure in an ammonia gas atmosphere.

Figure 1D:
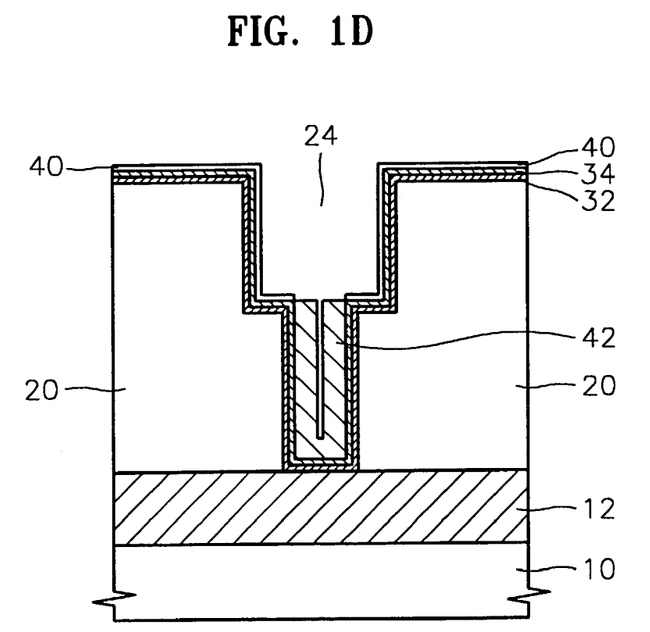

Referring to FIG. 1D, a first metal layer 42 can be formed only on the barrier metal layer 34 in the contact hole 22 exposed through the metal deposition prevention layer 40, using selective chemical vapor deposition. For example, the first metal layer 42 can be formed of Al. A selective metal organic CVD (MOCVD) process may be adopted to form the first metal layer 42. The selective MOCVD process of forming the first metal layer 42 of Al can be performed using a precursor formed of an organometallic compound such as dimethylaluminum hydride (DMAH), dimethylethylamine alane (DMEAA), and/or methylpyrrolidine alane (MPA), as an aluminum source, at a temperature between about 100 and 150° C., preferably, at a deposition temperature of about 120° C., and at a pressure between 0.5 and 5 torr, preferably, at a pressure of about 1 torr. In this case, a raw material conveyor such as a bubbler, a vapor flow controller, or a liquid delivery system, may be used to supply the precursor to a CVD chamber. An inert gas formed of Ar and/or Ne can be used for a carrier gas.

Figure 1E:
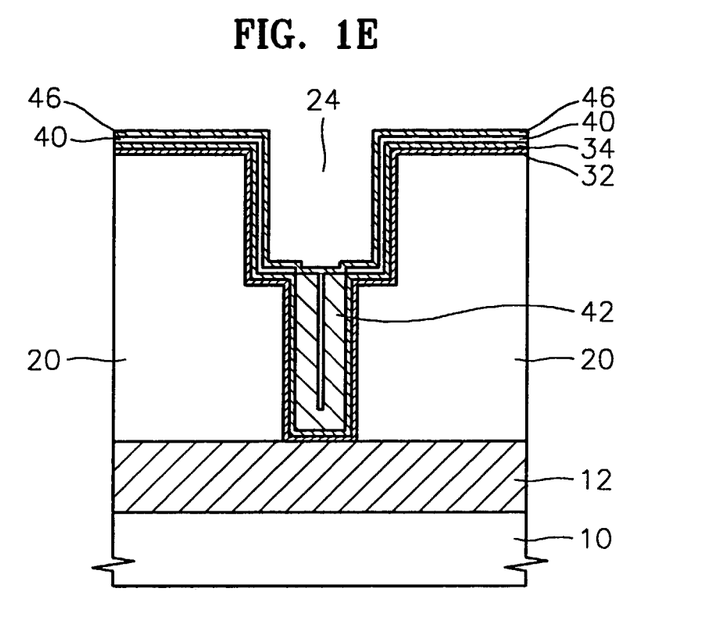

Referring to FIG. 1E, a wetting layer 46 can be formed on the metal deposition prevention layer 40. The wetting layer 46 can be a conductive layer formed such that a conductive metal layer is fully deposited on the metal deposition prevention layer 40. The wetting layer 46 may be formed of a conductive layer, for example, Ti, TiN, Ta, TaN, or combinations thereof such as Ti/TiN. The wetting layer 46 may be formed by CVD and/or PVD. A deposition process of forming the wetting layer 46 can be performed in a separate reactive chamber other than a reactor used in forming the first metal layer 42.

Figure 1F:
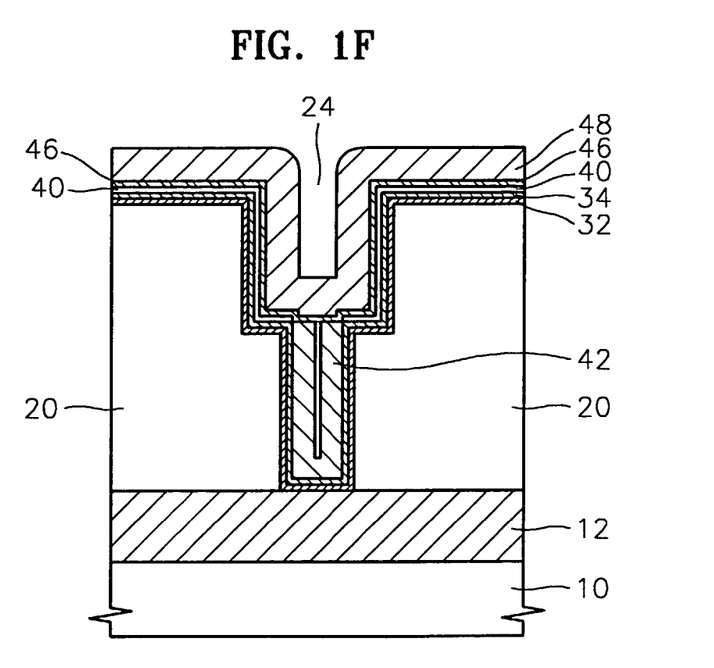

Referring to FIG. 1F, a second metal layer 48 is formed to the thickness of about 300 Å or more than on the wetting layer 46 using CVD. A metal organic CVD (MOCVD) process may be adopted to form the second metal layer 48. The MOCVD process of forming the second metal layer 48 of Al can be performed using a precursor including an organometallic compound such as DMAH, DMEAA, and/or MPA, as an aluminum source, at a temperature between about 100 and 200° C., preferably, at a deposition temperature of about 150° C., and at a pressure between about 0.5 and 5 torr, preferably, at a pressure of about 1 torr. In this case, an inert gas formed of Ar and/or Ne can be used for a carrier gas.

Figure 1G:
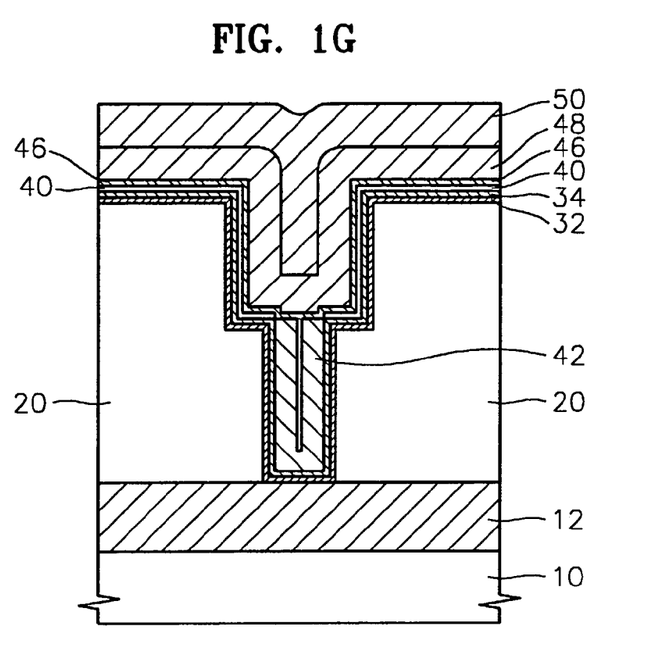

Referring to FIG. 1G, a third metal layer 50 can be formed so as to fill the remaining space of the trench 24 whose part is filled with the second metal layer 48. The third metal layer 50 can be formed by physical vapor deposition (PVD). Preferably, the third metal layer 50 can be formed of Al or Al alloy.

Methods such as DC sputtering, DC magnetron sputtering, AC sputtering, or AC magnetron sputtering, may be used to form the third metal layer 50 by PVD. Preferably, the third metal layer 50 can be formed by DC magnetron sputtering. A step of forming the third metal layer 50 may be performed using monolithic cluster tool type equipment without breaking a vacuum atmosphere after forming the second metal layer 48.

Figure 1H:
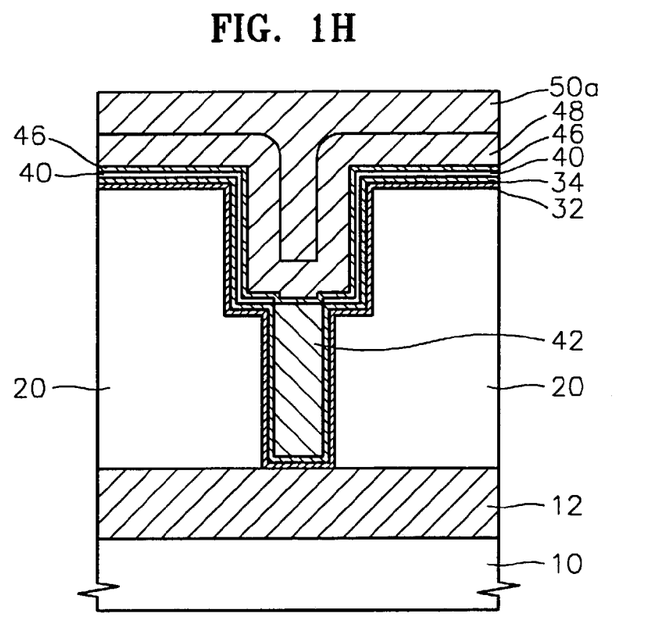

Referring to FIG. 1H, a structure including the third metal layer 50 can be heat-treated and reflowed. For example, the structure including the third metal layer 50 can be heat-treated in a vacuum atmosphere and/or in an inert gas atmosphere such as argon (Ar), for several seconds to several minutes, preferably, for about 30 to 180 seconds, at a temperature between about 350 and 600° C. The heat-treatment process for reflow can preferably be performed when surface oxidization of the third metal layer 50 is suppressed. Thus, the heat-treatment process can be performed at a pressure less than about 1 torr, preferably, at a high vacuum state of less than about $10^{-6}$ torr.

When the structure including the third metal layer 50 is heat-treated under the above conditions, metal layers may move due to reflow such that the contact hole 22 can be completely filled with metal, and a metal layer 50a having a planarized top surface can be formed.

As described above, in a step where metal interconnections of a semiconductor device having a dual damascene structure are formed using a PMD process, the first metal layer can first be formed in the contact hole using selective CVD when the metal deposition prevention layer is formed on the top surface of patterned the ILD film and in the trench. Then, a deposition process comprising two steps, that is, a step of forming the second metal layer filling only part of the trench using CVD and a step of forming the third metal layer filling the reminder of the trench, can be used to fill the trench with the metal layer. Subsequently, before the second metal layer is formed, the wetting layer can be formed on the metal deposition prevention layer such that the trench is effectively filled with the metal layer. If metal interconnections of a semiconductor device having a dual damascene structure are formed as discussed above, metal interconnections formed in trenches having a high aspect ratio used in highly-integrated semiconductor devices with relatively small design rules, can be formed relatively easily.

Figure 2A:
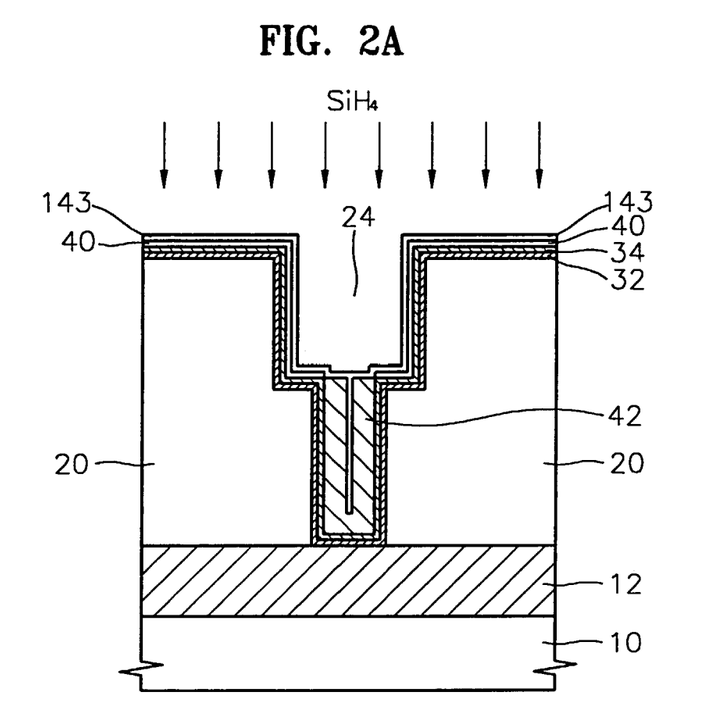
FIGS. 2A and 2B are cross-sectional views illustrating methods of forming metal interconnections of a semiconductor device according to second embodiments of the present invention.
Figure 2B:
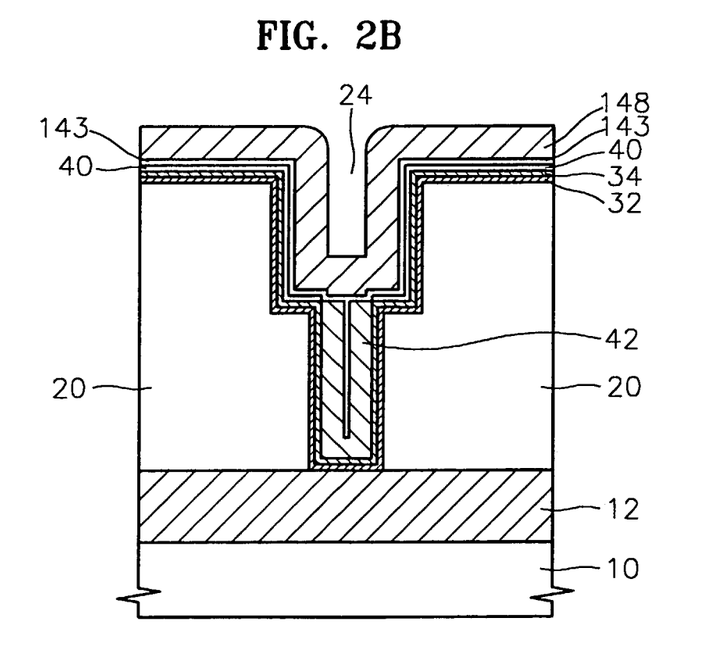

FIGS. 2A and 2B are cross-sectional views for explaining a method for forming metal interconnections of a semiconductor device according to second embodiments of the present invention. Unlike the first embodiments in which the wetting layer 46 is formed on the metal deposition prevention layer 40 before the second metal layer 48 is formed in the trench 24, the surface of the metal deposition prevention layer 40 is treated with a $SiH_4$ gas so as to control the selective deposition characteristics of the second metal layer 148 formed in the trench 24. More detailed descriptions thereof will be as follows.

Referring to FIG. 2A, as described with reference to FIGS. 1A through 1D, the patterned ILD film 20 includes contact hole 22 (by which the conductive region 12 is exposed), and trench 24. The ILD film 20 is formed on the semiconductor substrate 10, and resistive metal layer 32 and barrier metal layer 34 are sequentially formed on the entire surface of the structure including the ILD film 20. The metal deposition prevention layer 40 is then formed in the trench 24, and the first metal layer 42 is formed only in the contact hole 22. After that, a $SiH_4$ gas is supplied to the surface of the metal deposition prevention layer 40 such that the $SiH_4$ gas is adsorbed to the surface of the metal deposition prevention layer 40. As a result, a thin $SiH_4$ adsorption layer 143 is formed on the metal deposition prevention layer 40. The $SiH_4$ gas may be supplied to the surface of the metal deposition prevention layer 40 for about 20 seconds at the flow rate of about 100 sccm. In this case, a process temperature can be about between about 100 and 200° C. Argon (Ar) supplied at the flow rate of about 100 sccm may be used for a carrier gas when the $SiH_4$ gas is supplied to the surface of the metal deposition prevention layer 40.

Referring to FIG. 2B, as described with reference to FIG. 1F, a second metal layer 148 is formed on the $SiH_4$ adsorption layer 143 thereby filling part of the trench 24. In this case, the $SiH_4$ adsorption layer 143 is formed on the metal deposition prevention layer 40, and thus the selective deposition characteristics of the second metal layer 148 may be reduced and/or eliminated. Thus, the second metal layer 148 can be formed to an approximately uniform thickness on the entire surface of the $SiH_4$ adsorption layer 143. Here, a step of forming the first metal layer 42, a step of forming the $SiH_4$ adsorption layer 143, and a step of forming the second metal layer 148 may be consecutively performed in an identical reaction chamber. After the second metal layer 148 is formed, metal interconnections of a semiconductor device having a dual damascene structure can be completed as described with reference to FIGS. 1G and 1H.

Figure 3:
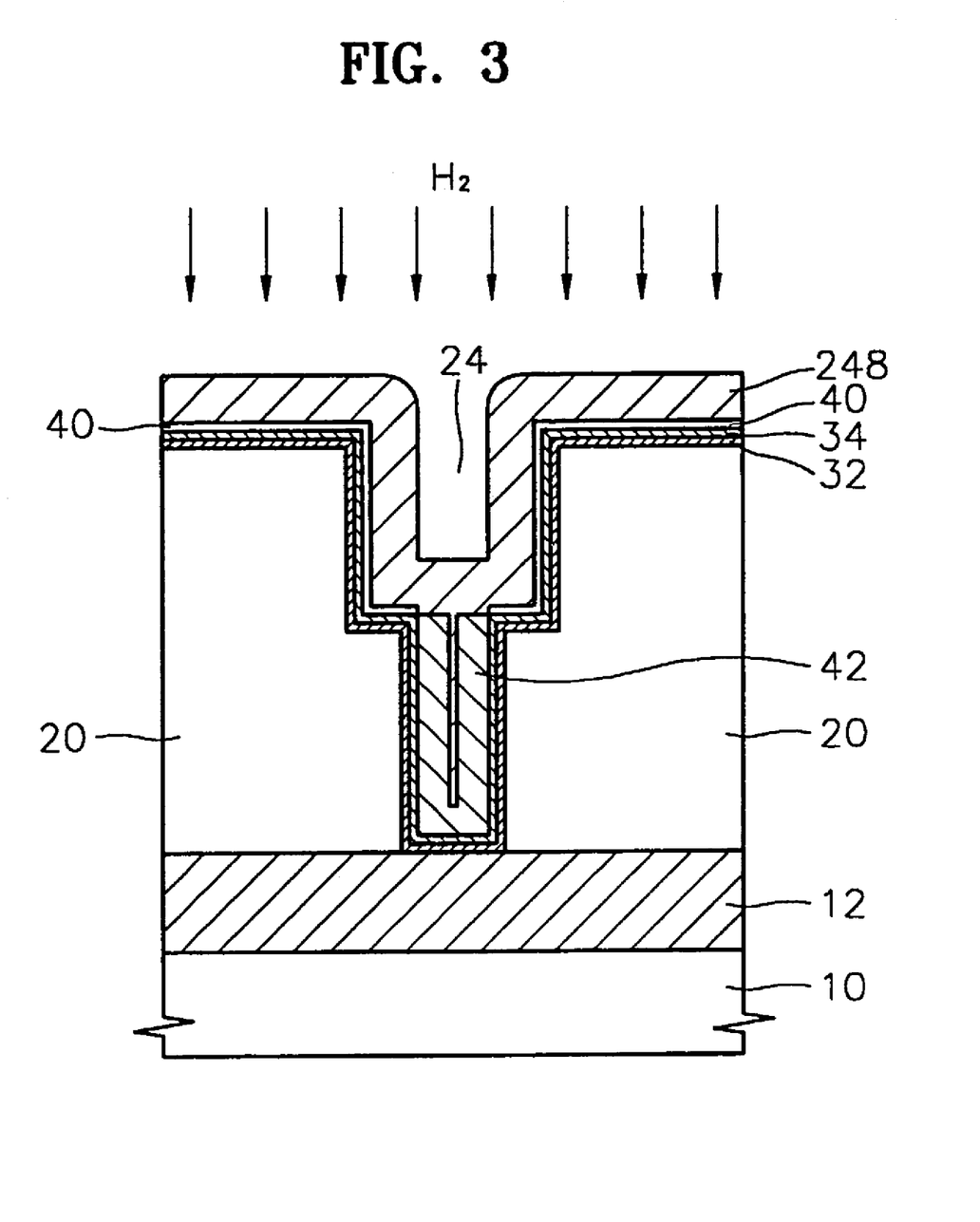
FIG. 3 is a cross-sectional view illustrating methods for forming metal interconnections of a semiconductor device according to third embodiments of the present invention.

FIG. 3 is a cross-sectional view illustrating methods for forming metal interconnections of a semiconductor device according to third embodiments of the present invention.

Referring to FIG. 3, as described with reference to FIGS. 1A through 1D, the patterned ILD film 20, including contact hole 22 (by which the conductive region 12 is exposed) and trench 24, is formed on the semiconductor substrate 10. Resistive metal layer 32 and barrier metal layer 34 are sequentially formed on the entire surface of the structure including the ILD film 20. Then the metal deposition prevention layer 40 is formed in the trench 24, and the first metal layer 42 is formed only in the contact hole 22. After that, a second metal layer 248 is formed directly on the metal deposition prevention layer 40 using nonselective CVD, thereby filling part of the trench 24. In this case, conditions of forming the second metal layer 248 formed of Al may be identical with those of the step of forming the second metal layer 48 described with reference to FIG. 1F, except that a reactive gas such as $H_2$, is used for a carrier gas so as to reduce and/or eliminate the selective deposition characteristics of the second metal layer 248. The $H_2$ gas contributes to promote the decomposition of the precursor used for an Al source such that the Al layer is fully deposited on the metal deposition prevention layer 40. According to some embodiments, only an $H_2$ gas or a mixed gas of $H_2$ and Ar may be used as a carrier gas to form the second metal layer 248.

After the second metal layer 248 is formed, metal interconnections of a semiconductor device having a dual damascene structure can be completed as described with reference to FIGS. 1G and 1H.

Figure 4A:
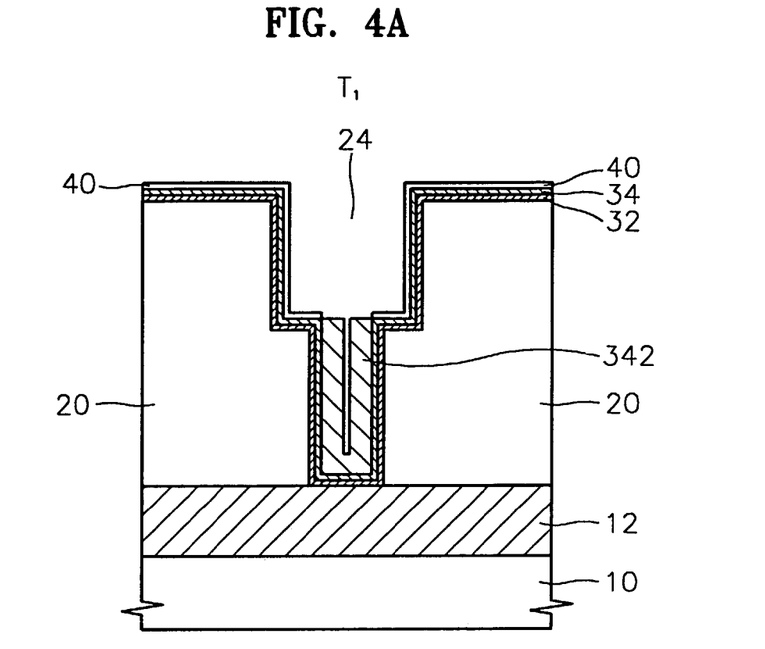
FIGS. 4A and 4B are cross-sectional views illustrating methods for forming metal interconnections of a semiconductor device according to fourth embodiments of the present invention.
Figure 4B:
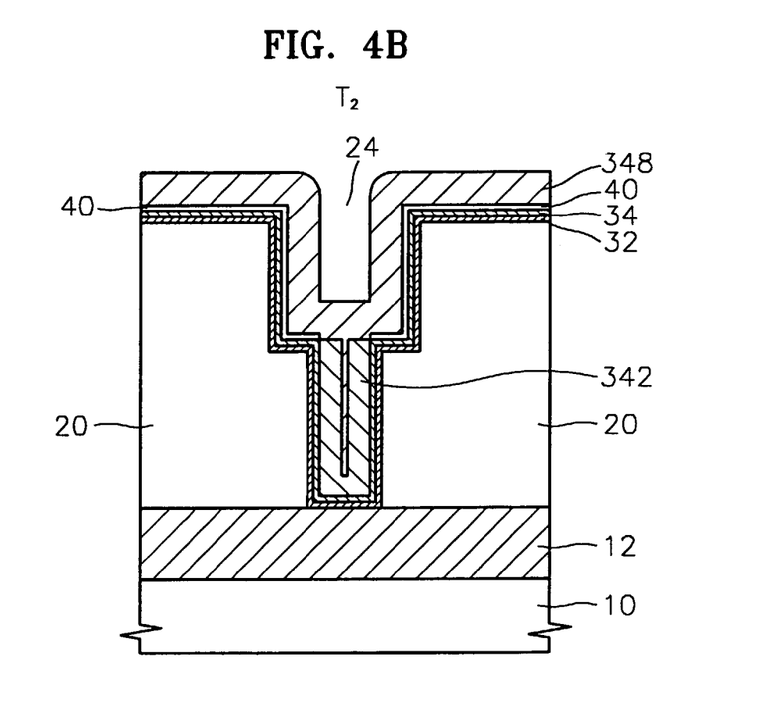

FIGS. 4A and 4B are cross-sectional views illustrating methods for forming metal interconnections of a semiconductor device according to fourth embodiments of the present invention. According to fourth embodiments, a deposition temperature can be varied so as to control the selective deposition characteristics of the second metal layer 348.

Referring to FIG. 4A, as described with reference to FIGS. 1A through 1D, the patterned ILD film 20 (including contact hole 22 by which the conductive region 12 is exposed and trench 24) is formed on the semiconductor substrate 10. Resistive metal layer 32 and barrier metal layer 34 are sequentially formed on the entire surface of the ILD film 20, and then the metal deposition prevention layer 40 is formed in the trench 24, and the first metal layer 342 is formed only in the contact hole 22 using selective CVD. As described with reference to FIG. 1D, to obtain the selective deposition characteristics when the first metal layer 342 is formed, the first metal layer 342 can be formed by MOCVD at a first deposition temperature $T_1$ between about 100 and 200° C.

Referring to FIG. 4B, a second metal layer 348 is formed on the structure including the first metal layer 342 using nonselective MOCVD. In order to reduce and/or eliminate the selective deposition characteristics when forming the second metal layer 348, a higher temperature between 200 and 350° C. is set to a second deposition temperature $T_2$. A nonselective MOCVD process of forming the second metal layer 348 of Al can be performed using a precursor comprising of an organometallic compound such as DMAH (Dimethylaluminum Hydride), DMEAA (Dimethylethylaminealane), and/or MPA (mercaptopropionic acid), as an aluminum source, at the second deposition temperature $T_2$ under the pressure between about 0.5 and 5 torr. Preferably, a step of stabilizing temperature can be performed to increase the first deposition temperature $T_1$ to the second deposition temperature $T_2$ before the second metal layer 348 is formed after the first metal layer 342 is formed. After the second metal layer 348 is formed, metal interconnections of a semiconductor device having a dual damascene structure can be completed as described with reference to FIGS. 1G and 1H.

In methods for forming metal interconnections of a semiconductor device according to embodiments of the present invention, the metal deposition prevention layer can be formed in the line-shaped trench used for exposed surfaces excluding the inside of the contact hole, that is, a dual damascene structure. Further, after the first metal layer is filled only in the contact hole using selective CVD, to effectively fill the trench having a high aspect ratio with the metal interconnection, the surface of the metal deposition prevention layer can be processed properly, and a deposition process including two steps (that is, a step of forming the second metal layer filling only part of the trench using CVD and a step of forming the third metal layer filling the reminder of the trench) can be performed. The selective deposition characteristics of the second metal layer can be controlled by varying conditions such as kinds of gas or deposition temperature used in the deposition process of forming the second metal layer.

By forming metal interconnections of a semiconductor device having a dual damascene structure as discussed above, metal interconnections of a semiconductor device having a dual damascene structure (which includes forming the trench having a high aspect ratio used for highly-integrated semiconductor devices with a small design rule) can be formed relatively easily.

According to embodiments of the present invention, methods can be provided that effectively form metal interconnections of a semiconductor device having a dual damascene structure, which may be required for a highly-integrated semiconductor device with a small design rule, adopting a preferential metal deposition (PMD) process.

According to embodiments of the present invention, methods are provided for manufacturing metal interconnections of a semiconductor device. An interlevel dielectric (ILD) film pattern (including a contact hole by which a conductive region is exposed and including a trench which communicates with the upper portion of the contact hole) is formed on a semiconductor substrate on which the conductive region is formed. A metal deposition prevention layer is formed on the top surface of the ILD film and the bottom surface and sidewalls of the trench such that the contact hole is exposed. A first metal layer is formed in the contact hole using chemical vapor deposition (CVD). A second metal layer is formed in the trench and on the upper portion of the ILD film using CVD. A third metal layer is formed on the second metal layer using physical vapor deposition (PVD). A resulting structure in which the third metal layer is formed is heat-treated and reflowed. The trench may constitute a line type interconnection region having an aspect ratio of more than 1.

Before forming the metal deposition prevention layer, the method may further include the steps of forming a resistive metal layer on the entire surface of the resulting structure in which the ILD film is formed and forming a barrier metal layer on the resistive metal layer. The resistive metal layer can be formed of Ti and/or Ta, and the barrier metal layer can be formed of TiN, TaN, TiAlN, TiSiN, TaAlN, TaSiN, and/or WN.

The metal deposition prevention layer can be formed of an aluminum oxide layer, an aluminum nitride layer, a tantalum oxide layer, a titanium oxide layer, and/or a silicon carbide (SiC) layer. To form the metal deposition prevention layer, a metal thin film can be formed on the top surface of the ILD film and the bottom surface and sidewalls of the trench. After that, the metal thin film can be oxidized. The metal thin film can be formed of Al, Zr, Ti, Ta, Sr, Mg, Ba, Ca, Ce, and/or Y. The metal thin film can be formed by direct current (DC) magnetron sputtering.

The step of oxidizing the metal thin film can be performed in an $O_2$ gas atmosphere. As another method, a mixed gas atmosphere of an oxygen-containing gas and an inert gas can be used to oxidize the metal thin film. The oxygen-containing gas can include $O_2$, $O_3$, and or $N_2O$. As still another method of oxidizing the metal thin film, the metal thin film can be exposed in air or to oxygen plasma.

To form the metal deposition prevention layer, a metal thin film can be formed on the top surface of the ILD film and the bottom surface and sidewalls of the trench. Subsequently, the metal thin film can be nitrided. To nitride the metal thin film, the metal thin film can be exposed to nitrogen plasma or can be rapidly heat-treated at an ammonia gas atmosphere.

Preferably, the metal thin film can be formed of Al. In this case, the first metal layer can be formed by selective metal organic CVD (MOCVD) using a precursor selected from dimethylaluminum hydride (DMAH), dimethylethylamine alane (DMEAA), and/or methylpyrrolidine alane (MPA). Preferably, the second metal layer can be formed of Al. The second metal layer can be formed by nonselective MOCVD using a precursor selected from DMAH, DMEAA, and/or MPA.

Before forming the second metal layer and after forming the first metal layer, the method may further include forming a wetting layer on the metal deposition prevention layer. In this case, the wetting layer can be formed of a conductive layer such as Ti, TiN, Ta, TaN, or a combination thereof. The wetting layer can be formed by CVD and/or PVD techniques. Before forming the second metal layer and after forming the first metal layer, the method may further include adsorbing $SiH_4$ to the surface of the metal deposition prevention layer. In this case, the steps of forming the first metal layer and adsorbing $SiH_4$ can be consecutively performed in an identical chamber.

In order to nonselectively form the second metal layer on the metal deposition prevention layer, the step of forming the first metal layer can be performed by selective MOCVD using a precursor selected from DMAH, DMEAA, and/or MPA, and a carrier gas formed of an inert gas, and the step of forming the second metal layer can be performed by nonselective MOCVD using a precursor selected from DMAH, DMEAA, and/or MPA, and a carrier gas including a reactive gas. For example, a carrier gas formed of Ar or Ne can be used in the step of forming the first metal layer, and a carrier gas including $H_2$ can be used in the step of forming the second metal layer. In this case, the steps of forming the first metal layer and forming the second metal layer, respectively, can be performed at deposition temperatures between about 100 and 150° C.

In addition, to nonselectively form the second metal layer on the metal deposition prevention layer, the step of forming the first metal layer can include forming a first Al layer by selective MOCVD at a first deposition temperature between about 100 and 200° C. In addition, the step of forming the second metal layer can include forming a second Al layer by nonselective MOCVD at a second deposition temperature between about 200 and 350° C. The third metal layer can be formed of Al and/or an Al alloy formed by DC magnetron sputtering. The step of heat-treating the resulting structure in which the third metal layer is formed can be performed at a temperature between about 350 and 500° C.

According to additional embodiments of the present invention, methods of manufacturing metal interconnections of a semiconductor device are provided. An insulating metal deposition prevention layer can be formed on an exposed surface (excluding a via hole) of a semiconductor substrate. A first metal layer is formed in the via hole. The surface of the insulating metal deposition prevention layer is treated such that metal can be deposited on the insulating metal deposition layer. A second metal layer is formed on the insulating metal deposition prevention layer having the treated surface and on the first metal layer. The exposed surface includes a line-shaped trench which communicates with the via hole in an upper portion of the via hole.

In the step of treating the surface of the insulating metal deposition prevention layer, a conductive wetting layer can be formed on the surface of the insulating metal deposition prevention layer, or $SiH_4$ can be adsorbed to the surface of the insulating metal deposition prevention layer.

According to still additional embodiments of the present invention, methods for manufacturing metal interconnections of a semiconductor device can be provided. An interlevel dielectric (ILD) film which defines a hole region for a via contact and a trench for an interconnection line that communicate with each other, can be formed on a semiconductor substrate. A barrier metal layer can be formed in the inner wall of the hole region and the inner wall of the trench. An insulating metal deposition prevention layer can be formed on the barrier metal layer in a region excluding the hole region. A first metal layer can be formed only in the hole region using selective chemical vapor deposition (CVD). A second metal layer can be formed on the insulating metal deposition prevention layer and the first metal layer using nonselective CVD. A third metal layer can be formed on the second metal layer using physical vapor deposition (PVD). A resulting structure in which the third metal layer is formed can be heat-treated and reflowed.

According to embodiments of the present invention, metal interconnections of a semiconductor device having a dual damascene structure, (which is constituted by forming the trench having a high aspect ratio as may be required for a highly-integrated semiconductor device with a small design rule), may be formed relatively easily.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of forming an integrated circuit device comprising:
   forming an interlevel dielectric film on an integrated circuit substrate, the integrated circuit substrate including a conductive portion thereof, wherein the interlevel dielectric film includes a contact hole therein exposing a portion of the conductive portion of the integrated circuit substrate and wherein the interlevel dielectric film includes a trench therein communicating with the contact hole wherein the trench is in a surface of the interlevel dielectric film opposite the integrated circuit substrate;
   forming a first metal layer using chemical vapor deposition (CVD) in the contact hole preferentially with respect to formation of the first metal layer on a surface of the interlevel dielectric film opposite the integrated circuit substrate wherein the first metal layer comprises aluminum;
   after preferentially forming the first metal layer in the contact hole, forming a second metal layer using chemical vapor deposition (CVD) on the surface of the interlevel dielectric film opposite the integrated circuit substrate and in the trench wherein the second metal layer comprises aluminum;
   after forming the second metal layer, forming a third metal layer using physical vapor deposition (PVD) on the second metal layer so that portions of the second metal layer in the trench are between the first and third metal layers wherein the third metal layer comprises aluminum; and
   reflowing the third metal layer.

2. A method according to claim 1 further comprising:
   before preferentially forming the first metal layer, forming a metal inhibiting layer on the surface of the interlevel dielectric film opposite the integrated circuit substrate and on sidewalls of the trench preferentially with respect to formation of the metal inhibiting layer in the contact hole.

3. A method according to claim 2 wherein the metal inhibiting layer comprises a metal oxide.

4. A method according to claim 3 wherein the metal inhibiting layer comprises an oxide of at least one metal of the group consisting of Al, Zr, Ti, Ta, Sr, Mg, Ba, Ca, Ce, and Y.

5. A method according to claim 2 wherein the metal inhibiting layer comprises a metal nitride layer.

6. A method according to claim 2 wherein the metal inhibiting layer comprises a silicon carbide layer.

7. A method according to claim 2 further comprising:
   after forming the first metal layer and before forming the second metal layer, treating the metal inhibiting layer to facilitate forming the second metal layer thereon.

8. A method according to claim 7 wherein treating the metal inhibiting layer comprises forming a wetting layer on the metal inhibiting layer opposite the integrated circuit substrate.

9. A method according to claim 8 wherein the wetting layer is selected from at least one of the group consisting of Ti, TiN, Ta, and TaN.

10. A method according to claim 2 further comprising:
    before forming the metal inhibiting layer, forming a barrier metal layer on sidewalls of the contact hole and the trench.

11. A method according to claim 10 wherein the barrier metal layer comprises at least one selected from the group consisting of TiN, TaN, TiAlN, TiSiN, TaAlN, TaSiN, and WN.

12. A method of forming an integrated circuit device comprising:
    forming an interlevel dielectric film on an integrated circuit substrate, the integrated circuit substrate including a conductive portion thereof, wherein the interlevel dielectric film includes a contact hole therein exposing a portion of the conductive portion of the integrated circuit substrate;
    forming a metal inhibiting layer on a surface of the interlevel dielectric film opposite the integrated circuit substrate preferentially with respect to formation of the metal inhibiting layer in the contact hole;

forming a first metal layer in the contact hole preferentially with respect to formation of the first metal layer on the metal inhibiting layer;

after forming the first metal layer, treating the metal inhibiting layer to facilitate forming a second metal layer thereon; and after preferentially forming the first metal layer in the contact hole and after treating the metal inhibiting layer, forming the second metal layer on the treated metal inhibiting layer opposite the integrated circuit substrate and on the first metal layer using chemical vapor deposition (CVD);

wherein the first metal layer comprise aluminum (Al) and wherein the second metal layer comprises aluminum (Al).

13. A method according to claim 12 wherein the interlevel dielectric film includes a trench therein communicating with the contact hole wherein the trench is in a surface of the interlevel dielectric film opposite the integrated circuit substrate, wherein the metal inhibiting layer is formed on sidewalls of the trench, and wherein the second metal layer is formed in the trench.

14. A method according to claim 13 further comprising:
before forming the metal inhibiting layer, forming a barrier metal layer on sidewalls of the contact hole and the trench.

15. A method according to claim 14 wherein the barrier metal layer comprises at least one selected from the group consisting of TiN, TaN, TiAlN, TiSiN, TaAlN, TaSiN, and WN.

16. A method according to claim 12 wherein the metal inhibiting layer comprises a metal oxide.

17. A method according to claim 12 wherein the metal inhibiting layer comprises an oxide of at least one metal of the group consisting of Al, Zr, Ti, Ta, Sr, Mg, Ba, Ca, Ce, and Y.

18. A method according to claim 12 wherein the metal inhibiting layer comprises a metal nitride layer.

19. A method according to claim 12 wherein the metal inhibiting layer comprises a silicon carbide layer.

20. A method according to claim 12 wherein treating the metal inhibiting layer comprises forming a wetting layer on the metal inhibiting layer opposite the integrated circuit substrate.

21. A method according to claim 20 wherein the wetting layer is selected from at least one of the group consisting of Ti, TiN, Ta, and TaN.

22. A method according to claim 12 further comprising:
after forming the second metal layer, forming a third metal layer on the second metal layer; and
reflowing the third metal layer.

23. A method according to claim 22 wherein the first metal layer comprises aluminum (Al), wherein the second metal layer comprises aluminum (Al), and wherein the third metal layer comprises aluminum (Al).

24. A method according to claim 12
wherein forming the first metal layer comprises forming the first metal layer using chemical vapor deposition and wherein forming the second metal layer comprises forming the second metal layer using chemical vapor deposition.

25. A method according to claim 24 wherein the first metal layer comprises aluminum (Al) and wherein the second metal layer comprises aluminum (Al).

26. A method of forming an integrated circuit device comprising:
forming an interlevel dielectric film on an integrated circuit substrate, the integrated circuit substrate including a conductive portion thereof, wherein the interlevel dielectric film includes a contact hole therein exposing a portion of the conductive portion of the integrated circuit substrate;

forming a metal inhibiting layer on a surface of the interlevel dielectric film opposite the integrated circuit substrate preferentially with respect to formation of the metal inhibiting layer in the contact hole;

forming a first metal layer in the contact hole preferentially with respect to formation of the first metal layer on the metal inhibiting layer;

after forming the first metal layer, treating the metal inhibiting layer to facilitate forming a second metal layer thereon; and after preferentially forming the first metal layer in the contact hole and after treating the metal inhibiting layer, forming the second metal layer on the treated metal inhibiting layer on the interlevel dielectric film opposite the integrated circuit substrate;

wherein forming the first metal layer comprises forming the first metal layer using chemical vapor deposition and wherein forming the second metal layer comprises forming the second metal layer using chemical vapor deposition.

* * * * *